United States Patent [19]

Ōmura

[11] Patent Number: 4,458,261
[45] Date of Patent: Jul. 3, 1984

[54] INSULATED GATE TYPE TRANSISTORS

[75] Inventor: Yasuhisa Ōmura, Iruma, Japan

[73] Assignee: Nippon Telegraph & Telephone Public Corp., Tokyo, Japan

[21] Appl. No.: 304,281

[22] Filed: Sep. 21, 1981

[30] Foreign Application Priority Data

Sep. 19, 1980 [JP] Japan ............... 55-129067

[51] Int. Cl.³ ................................. H01L 29/78
[52] U.S. Cl. .................. 357/23.7; 357/23.12; 357/23.1; 357/35
[58] Field of Search ........... 357/23 R, 23 TF, 23 D, 357/13, 35

[56] References Cited

U.S. PATENT DOCUMENTS

| | | | |
|---|---|---|---|
| 3,339,086 | 8/1967 | Shoikly | 357/23 R |
| 4,050,965 | 9/1977 | Ipri | 357/23 TF |
| 4,233,616 | 11/1980 | Kyomasu | 357/13 |
| 4,247,863 | 1/1981 | Togei | 357/13 PT |

OTHER PUBLICATIONS

Nishizawa, I.E.E.E. Trans. Electronic Devices, vol. ED-22, No. 4, April, 1975, pp. 185-197.

Primary Examiner—Martin H. Edlow
Attorney, Agent, or Firm—Remy J. VanOphem

[57] ABSTRACT

An insulated gate type transistor has a nonsaturating current characteristic as well as a saturating current type characteristic. P+, N, N+ or N+, P, P+ regions are juxtaposed in the horizontal direction in a semiconductor layer formed on an insulating layer. A gate electrode is provided on a portion of the N or P region through a gate insulating film, and the thickness of the N or P region beneath the gate electrode is less than $\pi/2$ times of a Debye length inherent to the semiconductor constituting the active region.

14 Claims, 12 Drawing Figures

INSULATED GATE TYPE TRANSISTORS

BACKGROUND OF THE INVENTION

This invention relates to a transistor, and more particularly an insulated gate type transistor.

As active elements, various types of transistors have been developed. According to the current characteristics, they are classified into a transistor having a saturation type current characteristic such as a junction type bipolar transistor, a field effect transistor or the like which has the same characteristic as a pentode, and a nonsaturation type current transistor such as a static induction transistor (SIT). Various constructions have been proposed for the former type to meet various fields of applications. However, as this type has a saturating current characteristic it is not suitable for a transistor required to handle a large current. For this reason, attention has been directed to transistors as a SIT having a nonsaturating current characteristic.

As disclosed in a paper of I.E.E.E. Transactions of Electronic Devices, Vol. Ed-22, No. 4, April, 1975, pages 185-197, for example, the SIT has a fundamental construction consisting of a source region having an N+ diffused layer formed on the surface on an N type substrate, a gate region consisting of a P+ diffused layer adjacent to the source region and having a larger depth than the N+ diffused layer, and a drain region made up of an N+ diffused layer formed on the rear surface of the substrate, and wherein the thickness of a depletion layer is controlled in accordance with the magnitude of a gate voltage applied upon the gate region so as to ON/OFF-control the current path between the source region and the drain region.

Since the SIT is a unipolar element utilizing only the majority carriers as the carrier, the limit of its current density is about $10^3 A/cm^2$. Therefore, it has a fatal defect, in that, it is impossible to have a current density higher than this upper limit. In order to manifest sufficiently high performance, it is desirable to construct an SIT having a vertical construction. Such vertical construction, however, makes it difficult to fabricate the SIT as an integrated circuit. For example, in order to fabricate the SIT into an integrated circuit, it is generally necessary to provide the drain terminal to the side of the source terminal. To this end, it is necessary to provide a burried layer having a high impurity concentration region which interconnects the burried layer to the drain electrode just like a vertical type bipolar transistor. This not only increases the number of manufacturing steps but also complicates the same and increases the serial resistance of the element. Moreover, when the SIT has a vertical construction it can be used to fabricate only two dimentional LSIs which are expected to be used frequently in the future.

In order to provide a nonsaturating characteristic to a SIT utilizing an N type silicon substrate, for example, the voltage $V_{GS}$ impressed between the gate electrode and the source region, and the voltage $V_{DS}$ impressed upon the drain region are restricted to a range expressed by a relation $V_{GS} < V_{DS} < 0$. It is, therefore, impossible for the SIT to fabricate a circuit operating at any operating condition as well as a logic circuit similar to a conventional MOS FET.

SUMMARY OF THE INVENTION

Accordingly, it is a principal object of this invention to provide an insulated gate type transistor capable of passing current at a high density.

Another object of this invention is to provide an insulated gate type transistor that can be used to fabricate an integrated circuit, especially a three dimensional LSI.

Still another object of this invention is to provide an insulated gate type transistor having a large gain constant and a small thermal noise.

A further object of this invention is to provide an insulated gate type transistor having a wide operation voltage range.

Briefly stated, the insulated gate type transistor of this invention consists of a first conductive type active region formed on an insulator layer, a first conductive type cathode region and a second conductive type anode region juxtaposed on the opposite sides of the active region. The thickness of the active region is made to be less than $\pi/2$ times of the Debye length and the transistor is constructed as a gate insulated type so as to provide not only a current saturation characteristic but also a nonsaturative characteristic.

These and further objects can be realized by providing an insulated gate type transistor, characterized by consisting of an insulating layer, an active layer made of a first conductive type semiconductor formed on the insulating layer, a cathode region made of a high impurity concentration semiconductor having a first conductivity type and located adjacent to the active region, an anode region made of a semiconductor of a second conductivity type adjacent to the active region but apart from the cathode region, a gate insulating film formed on the active region, and a gate electrode formed on the gate insulating film, the thickness of a portion of the active region being less than $\pi/2$ times of a Debye length inherent to the semiconductor constituting the active region.

BRIEF DESCRIPTION OF THE DRAWINGS

In the accompanying drawings.

DESCRIPTION OF THE PREFERRED EMBODIMENT

Figure 1:
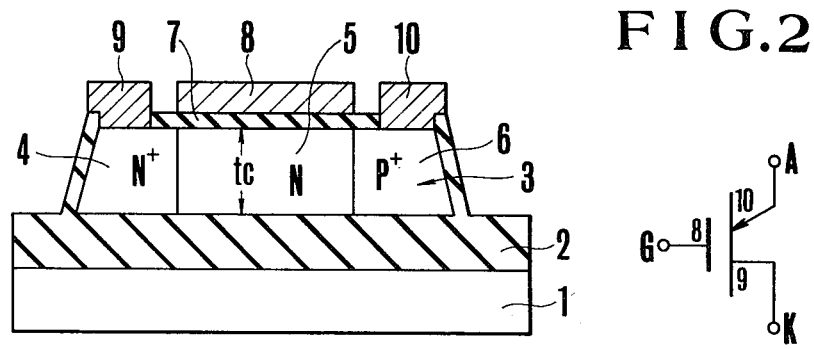
FIG. 1 is a sectional view showing one embodiment of the insulated gate transistor according to this invention.

The insulated gate transistor shown in FIG. 1 includes a semiconductor substrate 1 made of monocrystalline silicon having a specific resistance of $10^3$ ohm-cm and a thickness of 350 microns, an insulating layer 2 made of a silicon oxide having a thickness of 470 nm, for example, and a semiconductor layer 3 of monocrystalline silicon having a thickness of 260 nm and formed on the insulating layer 2. The construction wherein a semiconductor layer 3 of monocrystalline silicon is formed on an insulating layer is prepared by a method disclosed in U.S. Pat. No. 4,241,359, for example. In the example shown in FIG. 1, the semiconductor layer 3 includes a cathode region 4, an active region 5, and an anode region 6 which are juxtaposed in the horizontal direction in the order mentioned. The cathode region 4 is made of an N+ monocrystalline silicon layer having a donor concentration of $5 \times 10^{19}$ atoms/cm$^3$, for example, while the active region 5 has the same conductivity type as the cathode region 4 and is made of an N monocrystalline silicon layer having a low donor impurity concentration of $4 \times 10^{14}$ atoms/cm$^3$, for example. The anode region 6 has a conductivity type opposite to that of the cathode region 4 and is made of a P+ monocrystalline silicon layer having an acceptor impurity concentration of $2 \times 10^{20}$ atoms/cm$^3$, for example. The active region 5 is constructed to have a thickness of less than $\lambda/2$ times of the Debye length $L_{DE}$ inherent to the N monocrystalline silicon layer consisting of the active region 5.

In this case, the Debye length is the so-called extrinsic Debye length and can be expressed by the equation $$L_{DE} = \sqrt{\frac{2 \epsilon s KT}{q^2 N_D}} \qquad (1)$$

as disclosed in a text book A. Many et. al "Semiconductor Surfaces", published by North-Holland Publishing Company, 1965.

In the equation, $\epsilon s$ represents the dielectric constant of the semiconductor, and is equal to $11.17 \times 8.85 \times 10^{-14}$(F/cm) in the case of silicon; k is the Boltzmann's constant and equals $1.38 \times 10^{-23}$ (J/K); T is the absolute temperature (°K); q a unit charge quantity equal to $1.6 \times 10^{19}$ (Coulombs), and $N_D$ the carrier concentration of a semiconductor containing an impurity. Considering an example wherein the insulated gate type transistor of this invention is operated at room temperature and assuming that T=300° K., since $N_D$ is equal to the impurity concentration at room temperature (300° K.), where the donor impurity concentration of the N monocrystalline silicon consisting of the active region 5 is $4 \times 10^{14}$ atoms/cm$^3$, the Debye length would be about 290 nm. Accordingly, in this example, the thickness of the active region 5 should be less than 455 nm. A gate electrode 8 is formed on the active region 5 over a gate insulating film 7 made of a silicon oxide film having a thickness of 50 nm, for example, and on the cathode region 4 and the anode region 6 are respectively provided a cathode electrode 9 and an anode electrode 10 in ohmic contact with their respective regions.

In the construction example described above, the reason for making the thickness of the active region 5 less than $\lambda/2$ times of the Debye length $L_{DE}$ is that it is necessary to make the number of majority carriers (in this case electrons) in the active region 5 larger than the donor impurity concentration $N_D$ in the active region 5 where the voltage $V_{GK}$ impressed across the gate electrode 8 and the cathode electrode 9 is larger than the flat band voltage $V_{FB}$ at the interface between the active region 5 and the gate insulating film 7. The value of $\pi/2$ times can be derived from the following theoretical consideration. The distance in the direction of the depth of the active region 5 is determined by taking the interface between the active region 5 and the gate insulating film 7 as a reference and assuming the concentration of the majority carriers in the active regions 5 to be n(x). The value n(x) can be approximately expressed by the following Poison equation:

$$\frac{d^2\phi}{dx^2} = \frac{qn(x)}{\epsilon s} \qquad (2)$$

where $\phi$ represents the potential measured with reference to the Fermi level of the semiconductor, and $\epsilon s$ the dielectric constant of the semiconductor. The term n(x) satisfies the following equation under an equilibrium state.

$$n(x) = N_D \exp(q\phi/KT) \qquad (3)$$

Solving equations 2 and 3 under boundary conditions of $$\phi(d) = 0$$

$$\phi(0) = \phi s$$

$$\left.\frac{d\phi}{dx}\right|_{x=d} = 0$$

and a thickness d of an excess carrier concentration region, the value n(x) can be expressed by the following equation 4 by using the Debye length $L_{DE}$ (equation 1)

$$n(x) = N_D [\tan^2(x/L_{DE} - C) + 1] \qquad (4)$$

where $$C = \tan^{-1}\left[\sqrt{\exp(q\phi s/kT) - 1}\right]$$

in which $\phi s$ represents the surface potential where $x=0$.

Usually, as it is possible to make $\phi s \gg kT/q$ ($\approx 0.026$V), C becomes approximately equal to $\pi/2$.

Denoting the distance at which n(x) becomes equal to the donor impurity concentration $N_D$ of the active region 5 by d, since n(d)=$N_D$, we can determine the value of d from equation 4.

Thus, $$d = \pi/2 \ L_{DE}.$$

Accordingly, in order to satisfy a relation $n(x) > N_D$, the thickness $t_c$ of the active region 5 must satisfy a relation $$t_c < \pi/2 \ L_{DE}$$

Figure 2:
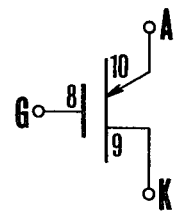
FIG. 2 is an equivalent circuit of the transistor shown in FIG. 1.

FIG. 2 shows the equivalent circuit of the insulated gate type transistor shown in FIG. 1.

The flat-band voltage $V_{FB}$ at the interface between the gate insulating film 7 and the active region 5 is expressed by the following equation $$V_{FB} = \phi_{ms} - Q_{ss}/C_{ox}$$

where $\phi_{ms}$ represents the difference between the work functions of the gate electrode material and the active region material, $C_{ox}$ is the gate capacitance per unit area, and $Q_{ss}$ is the interface charge density at the interface between the gate insulating film 7 and the active region 5. Thus, the voltage $V_{GK}$ creates the majority carriers, that is electrons, in the active region 5 and since the thickness of the active region is less than $\pi/2$ times of the Debye length, the active region 5 is filled or accumulated with electrons with the result that the anode junction would be reversely biased, thus stopping the injection of the minority carriers, that is holes, from the anode region 6, so as to turn off the gate insulated type transistor.

To turn on the gate insulated type transistor, $V_{GK}$ is made larger than $V_{FB}$ and, the potential, $V_{AK}$ is made larger than ($V_{GK}$). Then, the potential ($V_{GK} - V_{FB}$) at one end of the active region 5 close to the anode region 6 becomes lower than the anode potential $V_{AK}$ so that the anode junction would be forwardly biased. Consequently, as diagrammatically shown in FIG. 3B a large quantity of the minority carriers (holes) are injected into the active region 5 from the anode region 6, while at the same time, majority carriers (electrons) of the same quantity are injected into the active region 5 from the cathode region 4 to turn on the insulated gate type transistor thus passing the anode current $I_{AK}$. It is considered that the holes injected into the active region 5 from the anode region 6 would undergo perfect recombination at the recombination centers in the active region 5 and that the anode current $I_{AK}$ is made up of the recombination current of the holes and the drift current of the electrons corresponding thereto.

FIGS. 4A through 4D show the energy bands indicative of the nonsaturating current characteristic.

Figure 4A:
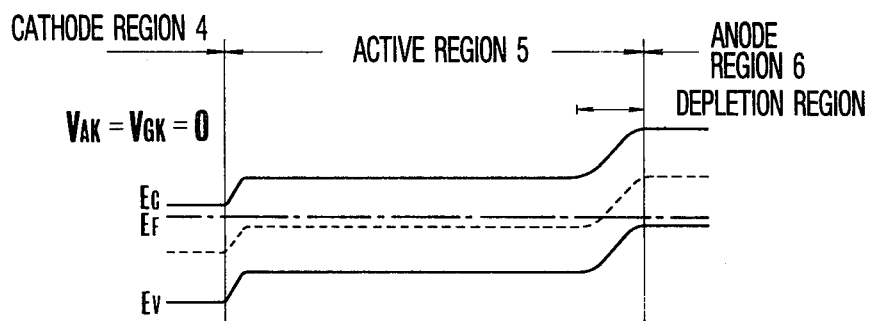
FIGS. 4A through 4D are graphs showing energy diagrams useful to explain the operation of the transistor shown in FIG. 1.

FIG. 4A shows the energy band where both voltages $V_{AK}$ and $V_{GK}$ are zero. More particularly, the energy band is slightly raised at the interface between the cathode region 4 and the active region 5 due to the flow of the electrons from the cathode region 4 to the active region 5 so that the energy band is flat in the active region 5 but raised upwardly because a depletion region due to build-in potential existing at the interface between the active region 5 and the anode region 6.

Figure 4B:
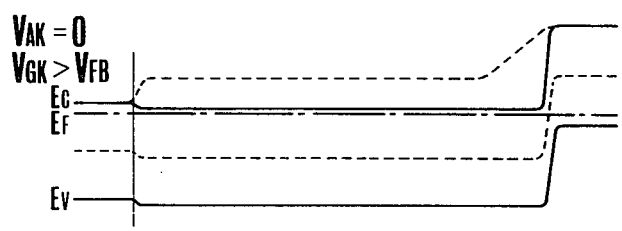
Figure 4C:
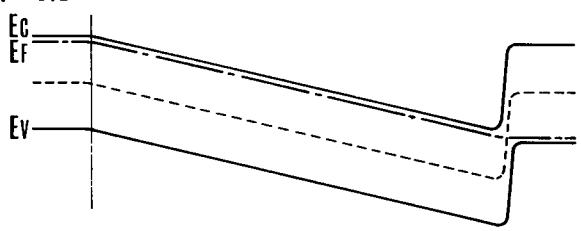
Figure 4D:
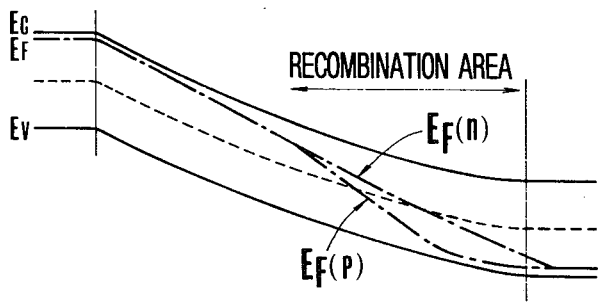

The energy band is shown by FIG. 4B where such voltage is applied to the gate electrode 8 that renders the voltage $V_{GK}$ to become larger than the flat band voltage $V_{FB}$ while the voltage $V_{AK}$ is maintained at zero volts. More particularly, owing to the impressed voltage $V_{GK}$, the energy band in the active region 5 becomes lower than that in the cathode region 4, whereas the energy band in the active region 5 is still flat because $V_{AK}=0$. The energy band at the end of the active region 5 near the anode region 6 is higher by ($V_{GK} - V_{FB}$) than that shown in FIG. 4A, this difference ($V_{GK} - V_{FB}$) preventing injection of the holes into the active region 5 from the anode region 6.

Where $V_{AK}$ is less than ($V_{GK} - V_{FB}$) and $V_{GK}$ is larger than $V_{FB}$, the energy band is shown in FIG. 4C. More particulary, when compared with FIG. 4B, since voltage $V_{AK}$ is impressed, the energy band in the active region 5 inclines toward the anode region 6, but since there holds a relation $V_{AK} < (V_{GK} - V_{FB})$, the anode junction is maintained in a reversely biased state so that no appreciable minority carriers, that is holes, would be injected from the anode region 6 into the active region 5. As above described, where the relation $V_{AK} < (V_{GK} - V_{FB})$ is satisfied, the insulated gate type transistor is turned off.

Where $V_{AK}$ is larger than ($V_{GK} - V_{FB}$), the anode junction is biased forwardly as above described so that a recombination region in which electrons recombine with the holes is formed at one end of the active region 5 near the anode region 6. Under this state, as shown in FIG. 4D, in the recombination region the majority carriers, that is electrons, and the minority carriers, that is holes, coexist so that the Fermi levels $E_F(n)$ and $E_F(p)$ of the electrons and holes respectively would appear.

Figure 3A:
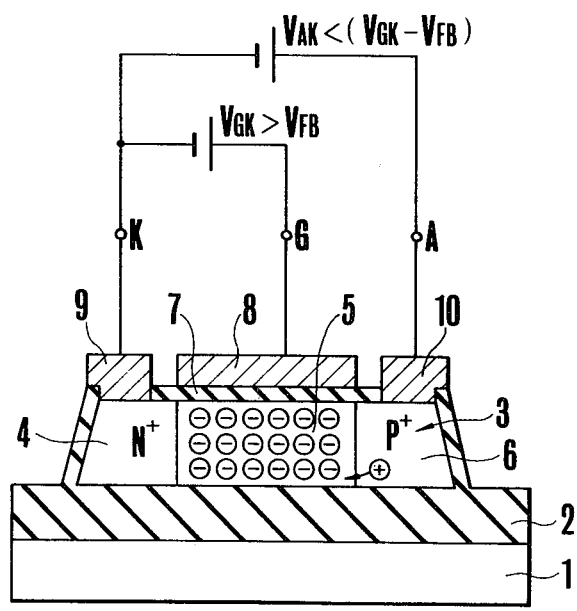
FIGS. 3A, 3B and 3C are sectional views useful to explain the operation of the transistor shown in FIG. 1 which also show voltages impressed upon various elements and the manner of generating electrons and holes by the impressed voltages.
Figure 3B:
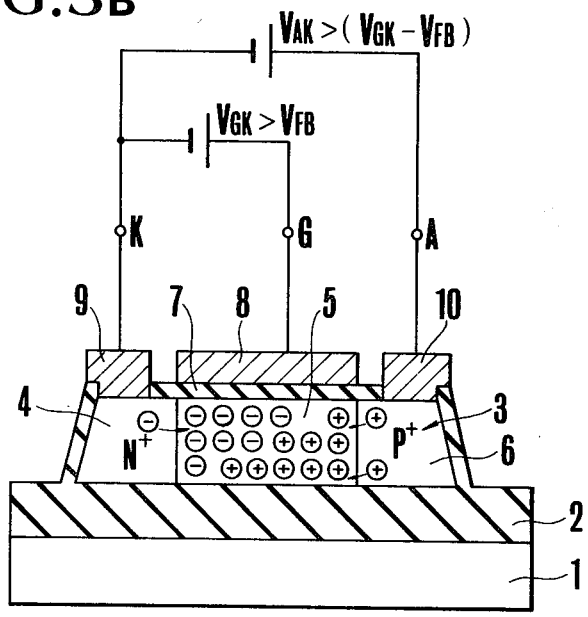
Figure 3C:
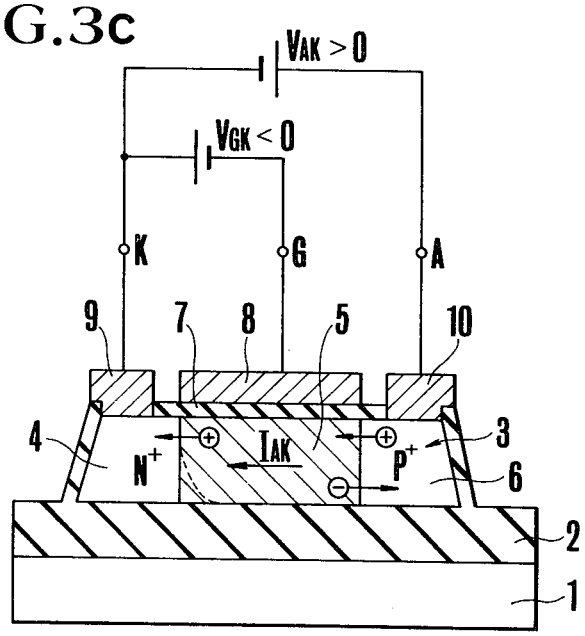

The insulated gate type transistor can be turned on by the voltage condition shown in FIG. 3C. As shown, a negative voltage $V_{GK}$ and a positive voltage $V_{AK}$, with reference to the cathode electrode 9, are applied to the gate electrode 8 and the anode electrode 10, respectively. Since the voltage $V_{GK}$ is negative, nearly all portions of the action region 5 become depleted so that an inversion region caused by the holes would be formed at and near the interface between the active region 5 and the gate insulating film 7. On the other hand, when the voltage $V_{AK}$ is positive, the holes are injected into the cathode region 4 from the anode region 6 through the inversion layer and the active region 5. At the same time, electrons are injected into the anode region 6 from the cathode region 4 through the active region 5. Consequently, the anode current flows between the anode electrode 10 and the cathode electrode 9. One example of the nonsaturable current characteristics obtained by the conditions described above are shown in FIGS. 5A and 5B.

These characteristics were obtained when the thickness of the insulating layer 2 was 470 nm, the thickness of the active region 5 was 260 nm, the donor impurity concentration of the active region 5 was $4 \times 10^{14}$ atoms/cm$^3$, the length and width of the channel formed in the active region 5 were 5 microns and 35 microns respectively. The thickness of the gate insulating film 7 was 50 nm, the thickness of the gate electrode was 500 nm, the impurity concentration in the cathode region was $5 \times 10^{19}$ atoms/cm$^3$ and the impurity concentration in the anode region was $2 \times 10^{20}$ atoms per cm$^3$.

Figure 5A:
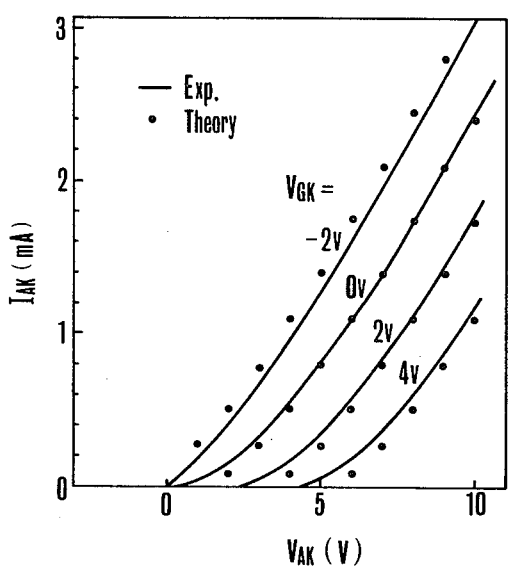
FIGS. 5A and 5B are graphs respectively showing the $I_{AK}$-$V_{AK}$ characteristic and the $I_{AK}$-$V_{GK}$ characteristic of the transistor shown in FIG. 1.

FIG. 5A shows $I_{AK}/V_{AK}$ characteristics and shows that where the voltage $V_{GK}$ is constant, the current $I_{AK}$ increases as the voltage $V_{AK}$ increases, thus exhibiting a nonsaturating type current characteristic. When $V_{GK}$ is increased, the initial value of $V_{AK}$ at which the current $I_{AK}$ begins to flow also increases thereafter, the $I_{AK}/V_{AK}$ characteristic is still nonsaturable. The reason that the initial value of $V_{AK}$ increases when $V_{GK}$ is increased is that when the voltage $V_{GK}$ is increased, the concentration of the majority carriers, that is electrons, is increased, which result in the increase of the potential in the active element, thus depleting the active region. Accordingly, it is necessary to raise the voltage $V_{AK}$ for the purpose of injecting the minority carriers from the anode region.

As above described, the insulated gate type transistor of this invention can obtain any anode current $I_{AK}$ with any voltage $V_{AK}$ by suitably selecting voltage $V_{GK}$, thus manifesting a very wide operating range.

Where the thickness of the action region is much larger than the Debye length $L_{DE}$, for example, $L_{DE}=0.29$ micron, and the thickness of the active region is about one micron, it is possible to obtain a nonsaturating type current characteristic. Under this condition, even when $V_{GK}$ is varied, although the slope of the characteristic varies, the initial value of the voltage $V_{AK}$ at which the current begins to flow does not vary, so that, the operating range in which any current $I_{AK}$ can be obtained, is extremely narrow.

Figure 5B:
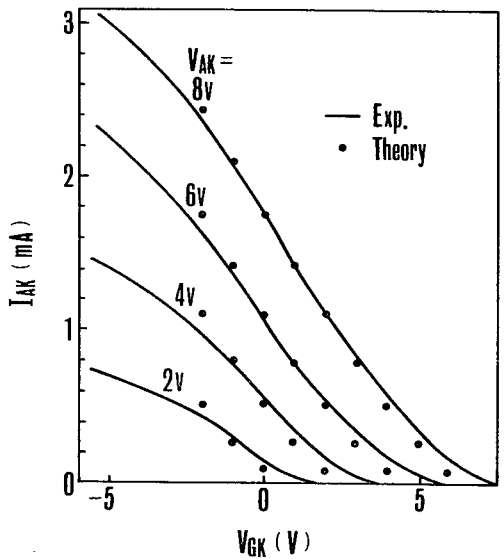

FIG. 5B shows the $I_{AK}/V_{GK}$ characteristics obtained by rewriting the characteristics shown in FIG. 5A with the $V_{GK}$ used as a parameter. When the voltage $V_{AK}$ is constant, $I_{AK}$ decreases as $V_{GK}$ increases. Such decrease in $I_{AK}$ with the increase of $V_{GK}$ is caused by the fact that the electron concentration n in the active region increases with the result that the Fermi potential in the active region increases, thus efficiently increasing the build-in potential of the PN junction.

As above described, when the nonsaturating current characteristic is manifested, in the insulated gate type transistor of this invention, both holes and electrons contribute to the flow of the current $I_{AK}$, making it possible to produce a large current. In the case shown in FIG. 5A, the current density is about $10^4$–$10^5 A/cm^2$ which is 10 to 100 times that of the SIT.

As above described, since the insulated gate transistor of this invention has a high current density, it can handle the same current with the element surface of only $\frac{1}{3}$ of that of the SIT, which is extremely advantageous for integrated circuitry.

The principle of operation for the saturated current characteristic will now be described.

Figure 6A:
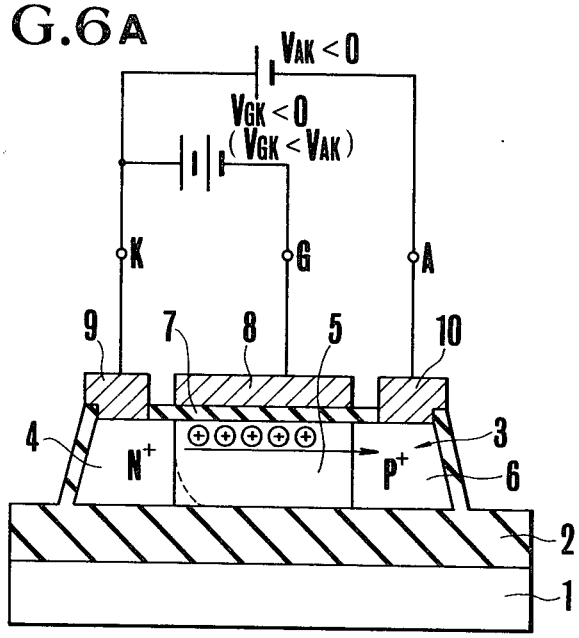
FIGS. 6A and 6B are sectional views showing the connection to the source for providing the saturated current characteristic for the insulated gate type transistor according to this invention and the behavior or movement of the carriers in an active region.
Figure 6B:
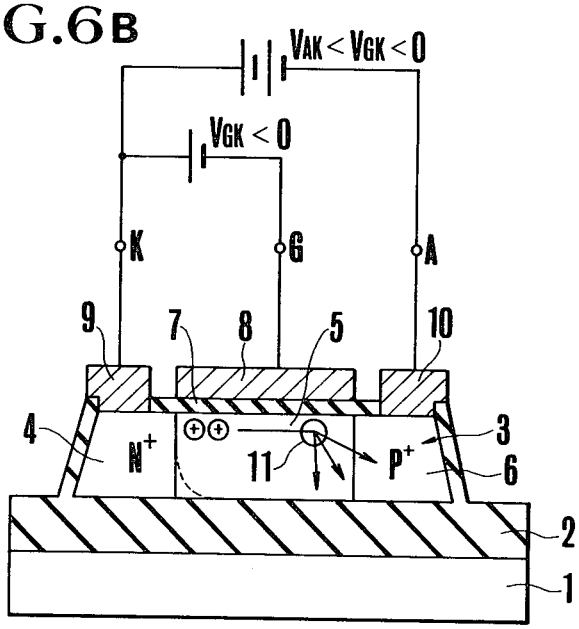

FIGS. 6A and 6B are diagrammatic representations of the connection of voltage sources and the behaviour of the carriers in the active region 5.

To obtain the saturated current characteristic, voltages $V_{GK}$ and $V_{AK}$, which are negative with respect to the cathode electrode 9, are applied to the gate electrode 8 and the anode electrode 10 respectively.

When $V_{GK}<V_{AK}<0$, an inversion layer, caused by the holes, is formed over the entire area of the interface between the active region 5 and the gate insulating film 7 as shown in FIG. 6A. At this time, since voltage $V_{AK}$ is negative, the cathode region 4 and the inversion layer caused by the holes are reversely biased, but, as the relation $|V_{GK}|>|V_{AK}|$ holds, the hole concentration in the inversion layer is high. Accordingly, an anode current $I_{AK}$, due to tunnel effect or avalanche effect, flows between the cathode region 4 and the active region 5. This current $I_{AK}$ increases with $|v_{AK}|$. Furthermore, as the hole concentration in the inversion layer increase with $|V_{GK}|$, $I_{AK}$ also increases.

In a case wherein $V_{AK}<V_{GK}<0$, as shown in FIG. 6B, the field created by $V_{AK}$ becomes stronger than the inversion layer bound field created by $V_{GK}$ at a portion of the interface between the active region 5 and the gate insulating film 7 near the anode region, thus causing a pinch off effect in which the inversion layer disappears at a point 11. The point 11 at which the inversion layer disappears is termed a pinch off point and the anode voltage under which the pinch off phenomenon occurs is termed a pinch off voltage $V_p$. This pinch off phenomenon increases the resistance value between the pinch off point 11 and the anode region 6 to a value much higher than the resistance value of the inversion layer itself. For this reason, in a case where a relation $|V_{AK}|\geq|V_p|$ holds, even if the term $|V_{AK}|$ is increased, the anode current $I_{AK}$ does not increase in any appreciable extent, meaning a saturation.

Figure 7:
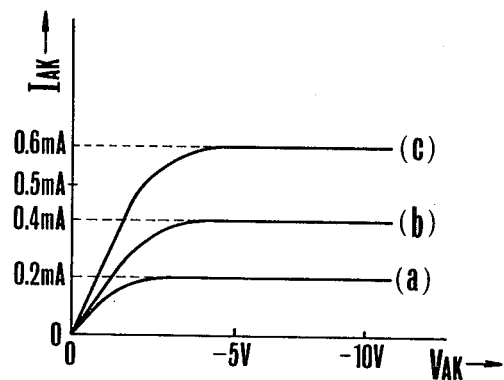
FIG. 7 is a graph showing one example of the saturated current characteristic of a transistor embodying the invention and having characteristics as shown in FIGS. 5A and 5B.

FIG. 7 shows saturated current characteristics obtainable according to the principle described above. These characteristics were obtained by using the insulated gate type transistor from which the nonsaturated current characteristics shown in FIGS. 5A and 5B were obtained. When the voltage $V_{GK}$ is $-5V$, the current $I_{AK}$ increases with the voltage $V_{AK}$ but saturates to a value of about 0.6 mA after the voltage $V_{AK}$ exceeds the pinch off voltage $-5V$.

Even when the absolute value of the voltage $V_{GK}$ is increased to $-3V$, $-4V$ and then $-5V$, the difference $(I_{AK}-V_{AK})$ manifests saturated current characteristics as shown by curves (a) (b) and (c) respectively.

In the embodiment described above, even when the active region 5 is made of a P monocrystalline silicon layer both nonsaturating and saturating current characteristics can be provided.

Since in the insulated gate transistor of the invention, it is possible to provide on the anode current from one surface of the substrate through a current path formed by the cathode region 4, the active region 5 and the anode region 6 which are juxtaposed in the horizontal direction, this transistor is suitable for fabricating an intergrated circuit.

Figure 8:
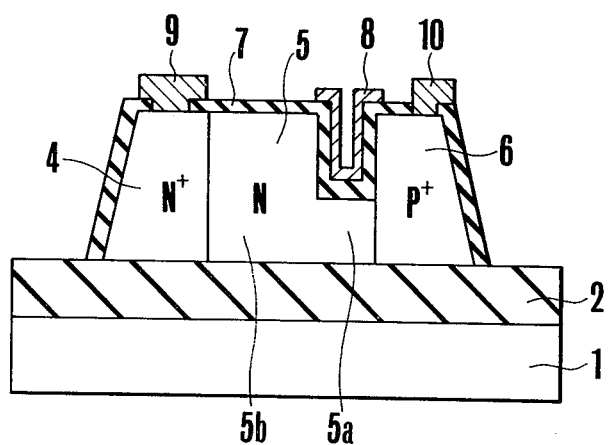
FIG. 8 is a sectional view showing a modified embodiment of the insulated gate type transistor of this invention.

FIG. 8 shows another embodiment of the insulated gate transistor of this invention in which portions corresponding to those shown in FIG. 1 are designated by the same reference numerals. In this modification, the active region 5 is constructed of a first active region 5a having a thickness of less than $\pi/2$ times of the Debye length $L_{DE}$ and a second active region 5b thicker than the first active region by about 1000 nm, for example, and the cathode region 4, the second active region 5b, the first active region 5a and the anode region 6 being juxtaposed in the horizontal direction in the order mentioned. A gate electrode 8 is formed on the first active region 5a through the gate insulating film 7.

Since construction, the first active region 5a has a thickness of less than $\pi/2$ times of the Debye length $L_{DE}$ and since it is located adjacent to the anode region 6, just like the embodiment shown in FIG. 1, it is possible to obtain a nonsaturating current characteristic as shown in FIG. 5A. Moreover, since the second active region 5b other than the first active region 5a of the active region 5 has a sufficiently large thickness, the resistance of the active region becomes smaller than that shown in FIG. 1 at the second active region. Accordingly, the modification shown in FIG. 8 can produce larger current than the construction shown in FIG. 1.

Figure 9A:
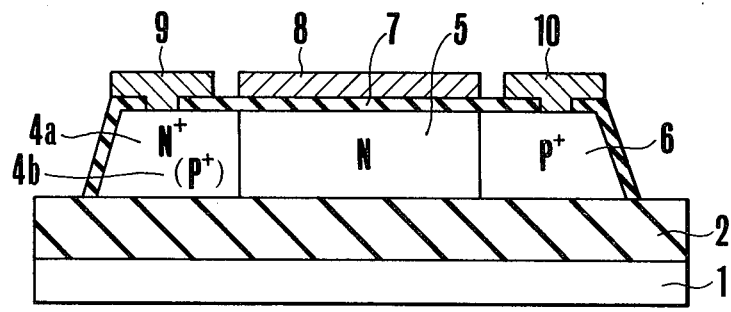
FIGS. 9A and 9B are sectional and plan views respectively showing still another modification of the insulated gate type transistor of this invention.
Figure 9B:
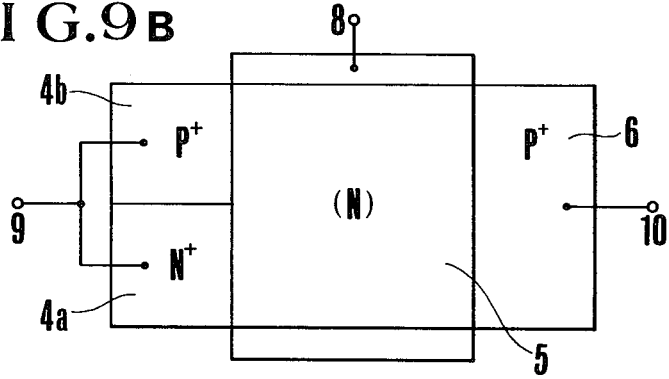

FIG. 9A shows still another embodiment of the insulated gate type transistor according to this invention, and FIG. 9B shows its plan view. In this modification, the cathode region 4 is constructed of a first cathode region 4a having a high N type impurity concentration, and a second cathode region 4b having a high P type impurity concentration; the first and second cathode regions 4a and 4b being formed in parallel with respect to the active region 5, with a common cathode electrode 9 being formed on the cathode regions 4a and 4b.

Figure 10:
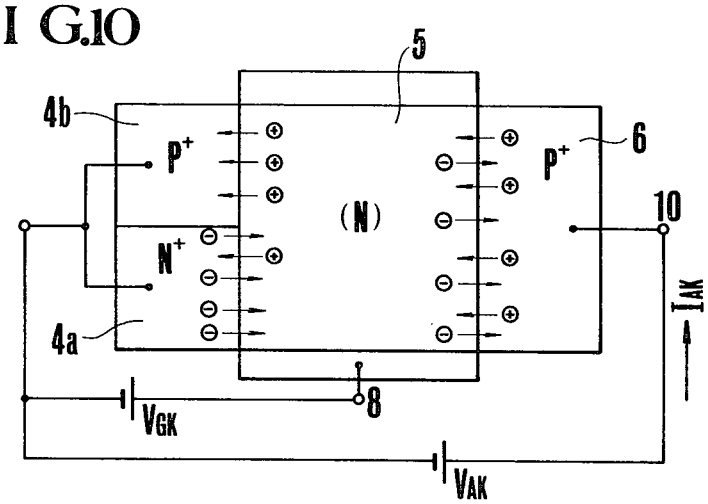
FIG. 10 is a diagrammatic representation useful to explain the operation of the transistor shown in FIG. 9.

The performance of this insulated gate type transistor is shown in FIG. 10 in which a voltage $V_{GK}$ and a voltage $V_{AK}$ which are positive with respect to the cathode electrode 9 were applied to the gate electrode 8 and the anode electrode 10, respectively. Where $V_{AK}$ is larger than $V_{GK}$, the holes injected into the active region 5 from the anode region 6 are efficiently recovered by the second cathode region 4b of the cathode region 4, having a high P type impurity concentration. As a consequence, electrons are vigorously injected into the anode region 6 from the first cathode region 4a having the N type high impurity concentration of the cathode region 4 through the active region 5. As a consequence, the resistance of the active region 5 which efficiently recovers the holes is substantially decreased than the embodiment shown in FIG. 1, in which, the cathode region 4 and the active region 5 are made of the same conductivity type material, that is N type monocrystalline silicon, so that it is possible to produce larger current.

Figure 11:
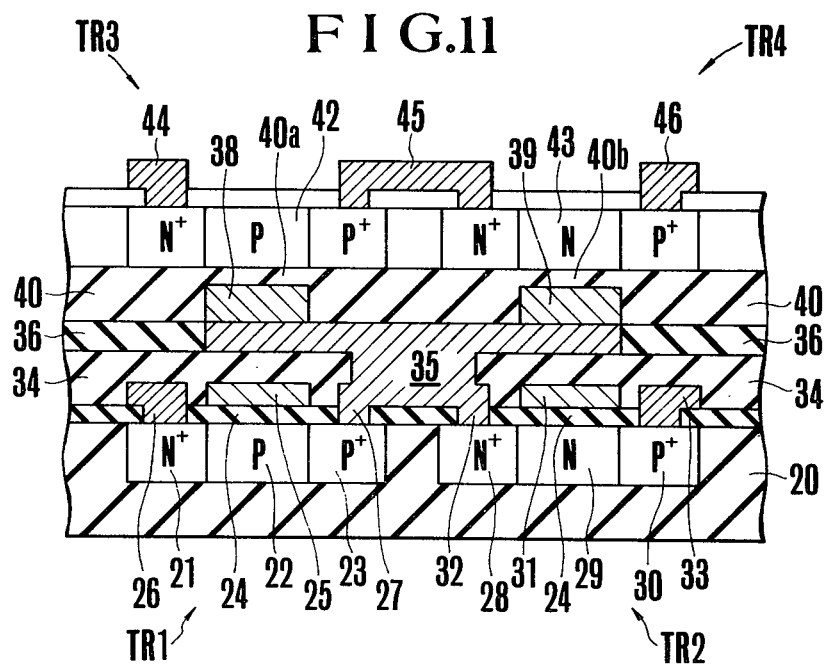
FIG. 11 is a sectional view showing a three dimensional LSI fabricated with the insulated gate type transistors embodying the invention.
Figure 12:
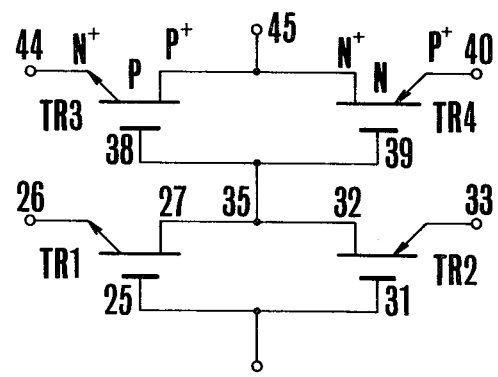
FIG. 12 shows an equivalent circuit of the LSI shown in FIG. 11.

FIG. 11 shows one example of a three dimensional LSI fabricated with the gate insulated type transistors of this invention and FIG. 12 shows its equivalent circuit.

In this example, an N+ type cathode region 21, a P type active region 22, and a p+ type anode region 23 are juxtaposed in the horizontal direction near the interface in the first insulating layer 20, and a first gate electrode 25 is formed on the active region 22 through a gate insulating film 24. Furthermore, a first cathode electrode 26 and a first anode electrode 27 are respectively connected to the cathode region 21 and the anode region 23 through ohmic contacts to form a first insulated gate type transistor TR1 of the lateral type. In the first insulating layer 20 are juxtaposed a N+ type cathode region 28, a N type active region 29 and a p+ type anode region 30 in the horizontal direction and adjacent the first transistor TR1. A second gate electrode 31 is mounted on the active region 29 through a gate insulating film 24, and a second cathode electrode 32 and an anode electrode 33 are respectively connected to the cathode region 28 and the anode region 30 with ohmic contacts to form a second insulated gate type transistor TR2. The gate electrodes 25 and 31 are commonly connected at a portion not shown. A second insulating layer 34 is provided to cover the first cathode electrode 26, the first gate electrode 25, the second gate electrode 31 and the second anode electrode 33. A perforation is provided through a portion of the second insulating layer 34 and the perforation is filled with an electroconductive material 35 for interconnecting the first anode electrode 27 and the second cathode electrode 32. A third insulating layer 36 is formed on the second insulating layer 34 to surround the electroconductive material 35. A fourth insulating layer 40 is provided to cover the third insulating layer 36, the third and fourth gate electrodes 38 and 39 and the electroconductive material 35. On this fourth insulating layer 40 are formed a third insulated gate type transistor TR3 of the same type as the first insulated gate type transistor TR1, and a fourth insulated gate type transistor TR4 of the same type as the second insulated gate type transistor TR2. A portion 40a of the insulating layer 40 comprises a gate insulating film of the third transistor TR3. FIG. 11 shows the active region 42 of the transistor TR3, the insulating film 40b of the fourth transistor TR4, the active region 43 thereof, the cathode electrode 44 of the third transistor TR3, an electrode 45 common to the anode electrode of the third transistor TR3 and the cathode electrode of the fourth transistor TR4, and the anode electrode 46 of the fourth transistor TR4.

Since the gate insulated type transistor of this invention is of the horizontal type different from the prior art vertical type SIT it is possible to form a large current three dimensional LSI.

As above described, the insulated gate type transistor of this invention can have a high current density so that it is suitable to form an integrated circuit, especially a three dimensional integrated circuit having a wide operating range. Moreover, since the transistor is of the insulated gate type it has a high input impedance thus rendering easy control. Further, since current is provided out in the forward direction at a PN junction of transistors TR1 and TR3, the output impedance is low thus decreasing equivalent thermal noise caused by a resistance. In addition as the transistor of this invention is of the bulk conductivity type it has large gain constants $G_{AK}(=\partial I_{AK}/\partial V_{AK})$ and $GM(=-\partial I_{AK}/\partial V_{GK})$. As the temperature increases, the Debye length increases in proportion to the square root of the temperature, whereby the Debye length becomes sufficiently larger than the thickness of the active region. Consequently, the majority carriers can readily accumulate in the active region so that even when a large current is handled there is no fear of thermal run out.

It should be understood that the invention is not limited to the specific embodiments described above and that many changes and modifications would be obvious to one skilled in the art. Thus, for example, instead of forming a monocrystalline semiconductor region on an insulating layer to impart a transistor function, a polycrystalline semiconductor region may be formed for providing a transistor function.

What is claimed is:

1. An insulated gate type transistor comprising:
   an insulating layer;
   an active region made of a first conductive type semiconductor formed on said insulating layer;
   a first region made of a high impurity concentration semiconductor having a first conductivity type and located adjacent to said active region;
   a second region made of a high impurity concentration semiconductor of a second conductivity type adjacent to said active region but apart from said first region;
   a gate insulating film formed on said active region;
   a gate electrode formed on said gate insulating and; a portion of said active region having a thickness less than $\pi/2$ times of a Debye length inherent to the semiconductor constituting said active region.

2. The transistor according to claim 1 wherein said first region acts as a cathode region and said second region acts as an anode region.

3. The transistor according to claim 1 wherein said first region acts as an anode region and said second region acts as a cathode region.

4. The transistor according to claim 1 wherein said active region is formed on said insulating layer.

5. The transistor according to claim 1 wherein said active region is embedded in said insulating layer.

6. The transistor according to claim 1 wherein said insulating layer is formed on a semiconductor substrate.

7. The transistor according to claim 1 wherein said insulating layer comprises a silicon oxide film.

8. The transistor according to claim 1 wherein said insulating layer is made of sapplire.

9. The transistor according to claim 1 wherein a portion of said active region other than portions thereof having a thickness less than $\pi/2$ times of the Debye length has a substantial thickness.

10. The transistor according to claim 2 wherein said cathode region has another cathode region at a portion in contact with said active region, said another cathode region being made of a semiconductor of the second conductivity type.

11. The transistor according to claim 1 wherein said active region, said first region and said second region formed on said insulating layer are made of a monocrystalline semiconductor.

12. An insulated gate type transistor comprising:
an insulating layer;
an active region formed on said insulating layer and is made of a semiconductor of a first conductivity type;
a first region located adjacent to said active region and is made of a semiconductor having the first conductivity type and a high impurity concentration;
a second region located adjacent to said active region but apart from said first region and is made of a second conductivity type semiconductor;
a gate insulating film formed on said active region, and
a gate electrode formed on said gate insulating film, thickness of a portion of said active region being less than $\pi/2$ times of a Debye length inherent to the semiconductor constituting said active region, wherein a plurality of said transistors being disposed three dimensionally on the opposite sides of an insulating layer.

13. The transistor according to claim 12 wherein said first region acts as a cathode region and said second region acts as an anode region.

14. The transistor according to claim 12 wherein said first region acts as an anode region and said second region acts as a cathode region.

* * * * *

UNITED STATES PATENT AND TRADEMARK OFFICE
CERTIFICATE OF CORRECTION

PATENT NO. : 4,458,261
DATED : July 3, 1984
INVENTOR(S) : Yasuhisa Omura

It is certified that error appears in the above-identified patent and that said Letters Patent is hereby corrected as shown below:

Column 1, line 20, delete "as" and insert ---- such as ----.

Column 1, line 35, delete "ON/OFF-control" and insert ---- provide ON/OFF-control to ----.

Column 1, line 50, delete "burried" and insert ---- buried ----.

Column 1, line 51, delete "burried" and insert ---- buried ----.

Column 1, line 57, delete "dimentional" and insert ---- dimensional ----.

Column 2, line 27, delete "characterized by".

Column 5, line 35, delete "than ($V_{GK}$). Then" and insert ---- than ($V_{GK}-V_{FR}$). Then ----.

UNITED STATES PATENT AND TRADEMARK OFFICE
CERTIFICATE OF CORRECTION

PATENT NO. : 4,458,261
DATED : July 3, 1984
INVENTOR(S) : Yasuhisa Omura

It is certified that error appears in the above-identified patent and that said Letters Patent is hereby corrected as shown below:

Column 5, line 39, after "Fig. 3B" insert a comma ---- , ----.

Column 5, line 60, after "because" insert ---- of ----.

Column 6, line 10, delete "particulary" and insert ---- particularly ----.

Column 6, line 17, delete "above described," and insert ---- described above, ----.

Column 6, line 21, delete "above described" and insert ---- described above ----.

Column 6, line 66, after "increases" insert a comma ---- , ----.

Column 7, line 3, delete "result" and insert ---- results ----.

Column 7, line 8, delete "above described," and insert ---- described above, ----.

Column 7, line 31, delete "above described," and insert ---- described above, ----.

Column 7, line 38, delete "above described," and insert ---- described above, ----.

UNITED STATES PATENT AND TRADEMARK OFFICE
CERTIFICATE OF CORRECTION

PATENT NO. : 4,458,261
DATED : July 3, 1984
INVENTOR(S) : Yasuhisa Omura

It is certified that error appears in the above-identified patent and that said Letters Patent is hereby corrected as shown below:

Column 7, line 46, delete "behaviour" and insert ---- behavior ----.

Column 8, line 31, after "Since" insert a comma ---- , ----.

Column 8, line 32, delete "on the" and insert --- an ----.

Column 8, line 35, after the numeral "6" insert ---- , ----.

Column 8, line 47, after the numeral "5a" insert ---- , ----.

Column 8, line 57, after the numeral "5b" insert ---- , ----. Same line, after the numeral "5a" insert ---- , ----.

Column 8, line 62, after "produce" insert ---- a ----.

Column 9, line 5, after "on the" insert ---- first and second ----.

Column 9, line 8, after "$V_{AK}$" insert ---- , ----.

Column 9, line 9, after the numeral "9" insert ---- , ----.

Column 9, line 19, after "region 5" insert ---- , ----.

Column 9, line 20, after "holes" insert ---- , ----. Same line, delete "than" and insert ---- as from the resistance experienced in ----.

UNITED STATES PATENT AND TRADEMARK OFFICE
CERTIFICATE OF CORRECTION

PATENT NO. : 4,458,261
DATED : July 3, 1984
INVENTOR(S) : Yasuhisa Omura

It is certified that error appears in the above-identified patent and that said Letters Patent is hereby corrected as shown below:

Column 9, line 23, after "that is" insert ---- , an ----.

Column 9, line 43, delete "a gate" and insert ---- the gate ----.

Column 9, line 44, delete "32 and an" and insert ---- 32 and a second ----.

Column 9, line 60, delete "the".

Column 9, line 61, after "38 and 39" insert ---- , ----.

Column 9, line 62, delete "this" and insert ---- the ----. Same line, delete "are" and insert ---- is ----.

Column 9, line 67, delete "comprises" and insert ---- includes ----.

Column 10, line 9, delete "type different from" and insert ---- type, contrary to ----.

Column 10, line 10, after "SIT" insert ---- , ----.

Column 10, line 12, delete "above described," and insert ---- described above, ----.

In the Claims

Column 11, line 6, after "active region" insert ---- , ----.

UNITED STATES PATENT AND TRADEMARK OFFICE
CERTIFICATE OF CORRECTION

PATENT NO. : 4,453,261
DATED : July 3, 1934
INVENTOR(S) : Yasuhisa Omura

It is certified that error appears in the above-identified patent and that said Letters Patent is hereby corrected as shown below:

Column 11, line 8, after "length" insert ---- , ----.

Column 11, line 10, delete "another" and insert ---- an other ----.

Column 11, line 11, delete "said another" and insert ---- said other ----.

Column 11, line 20, delete "is".

Column 12, line 2, delete "is".

Column 12, line 6, delete "is".

Column 12, line 9, delete "and".

Column 12, line 10, delete "film," and insert ---- film; and ----.

Column 12, line 11, delete "thickness of". Same line, delete "being" and insert ---- having a thickness ----.

UNITED STATES PATENT AND TRADEMARK OFFICE
CERTIFICATE OF CORRECTION

PATENT NO. : 4,458,261
DATED : July 3, 1984
INVENTOR(S) : Yasuhisa Omura

It is certified that error appears in the above-identified patent and that said Letters Patent is hereby corrected as shown below:

Column 12, line 14, delete "wherein" and insert ---- whereby ----
Same line, delete "being" and insert ---- are ----.

Signed and Sealed this

Twenty-eighth Day of May 1985

[SEAL]

Attest:

DONALD J. QUIGG

Attesting Officer

Acting Commissioner of Patents and Trademarks